Figure 1:
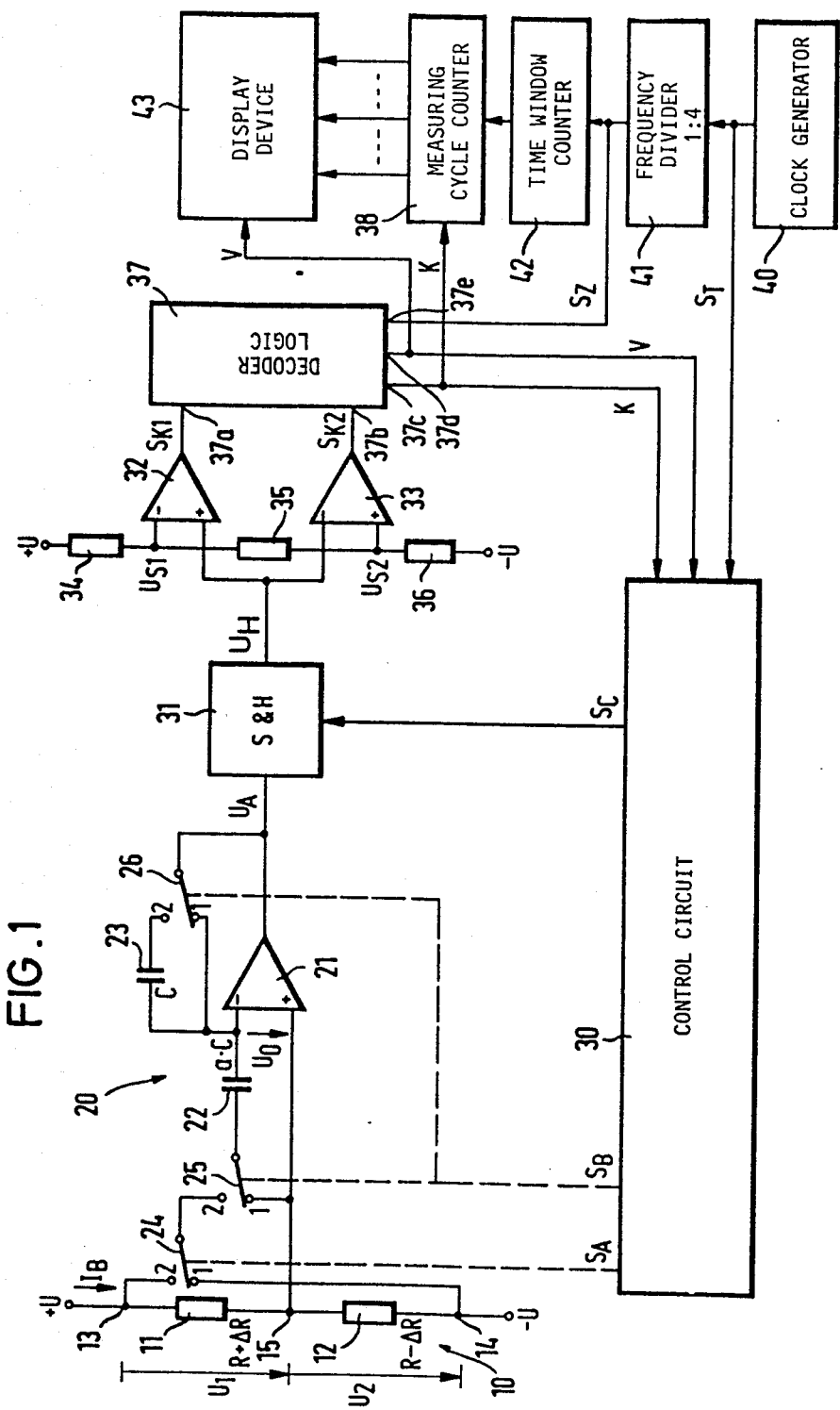

United States Patent [19]

Schneider

[11] Patent Number: 4,816,745

[45] Date of Patent: Mar. 28, 1989

[54] METHOD AND ARRANGEMENT FOR MEASURING THE RESISTANCE RATIO IN A RESISTANCE HALF-BRIDGE

[75] Inventor: Georg Schneider, Schopfheim-Langenau, Fed. Rep. of Germany

[73] Assignee: Endress u. Hauser GmbH u. Co., Fed. Rep. of Germany

[21] Appl. No.: 94,716

[22] Filed: Sep. 9, 1987

[30] Foreign Application Priority Data

Oct. 3, 1986 [DE] Fed. Rep. of Germany ....... 3633791

[51] Int. Cl.$^4$ ............................................. G01R 27/02
[52] U.S. Cl. ..................................... 324/62; 324/65 R
[58] Field of Search ................. 324/62, 65 R; 73/796, 73/862.67

[56] References Cited

U.S. PATENT DOCUMENTS 4,728,881  3/1988  Evans et al. ........................... 324/62

FOREIGN PATENT DOCUMENTS 48204  4/1982  Fed. Rep. of Germany ........ 324/62
47708  8/1977  U.S.S.R. ............................. 324/65 R Primary Examiner—Reinhard J. Eisenzopf
Assistant Examiner—Maura K. Regan
Attorney, Agent, or Firm—Barnes & Thornburg

[57] ABSTRACT

The measuring circuit is used to measure the resistance ratio $\Delta R/R$ in a resistance half-bridge comprising two series-connected resistors, of which the one resistor has the resistance $R+\Delta R$ and the other resistor the resistance $R-\Delta R$. The two resistances are traversed by the same current which generates a voltage drop at each resistor. By an integrating SC amplifier in successive sampling cycles difference voltages which are proportional to the difference between the voltage drops at the two resistors are integrated to give an integration voltage. Every time the integration voltage exceeds an upper threshold value or drops below a lower threshold value in a compensation cycle a compensation voltage directed oppositely to the difference voltage is superimposed on the integration voltage and is proportional to the sum of the voltage drops at the two resistors. As a measure of the resistance ratio $\Delta R/R$ the ratio of the number of compensation cycles to the number of sampling cycles is determined in that the compensation cycles are counted in a time window corresponding to a predetermined number of sampling cycles. The count indicated then directly represents in a corresponding scale the desired resistance ratio $\Delta R/R$.

21 Claims, 10 Drawing Sheets

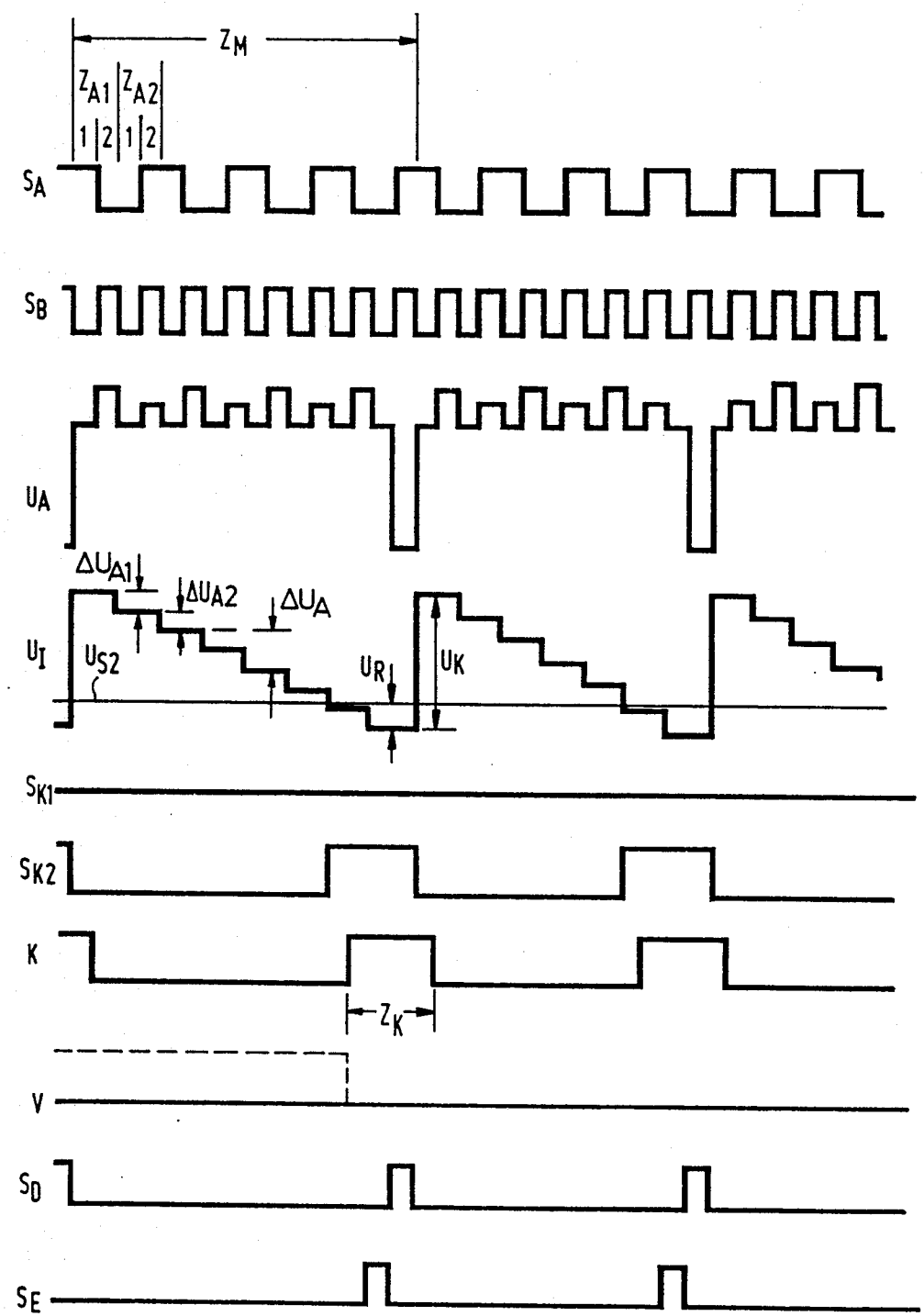

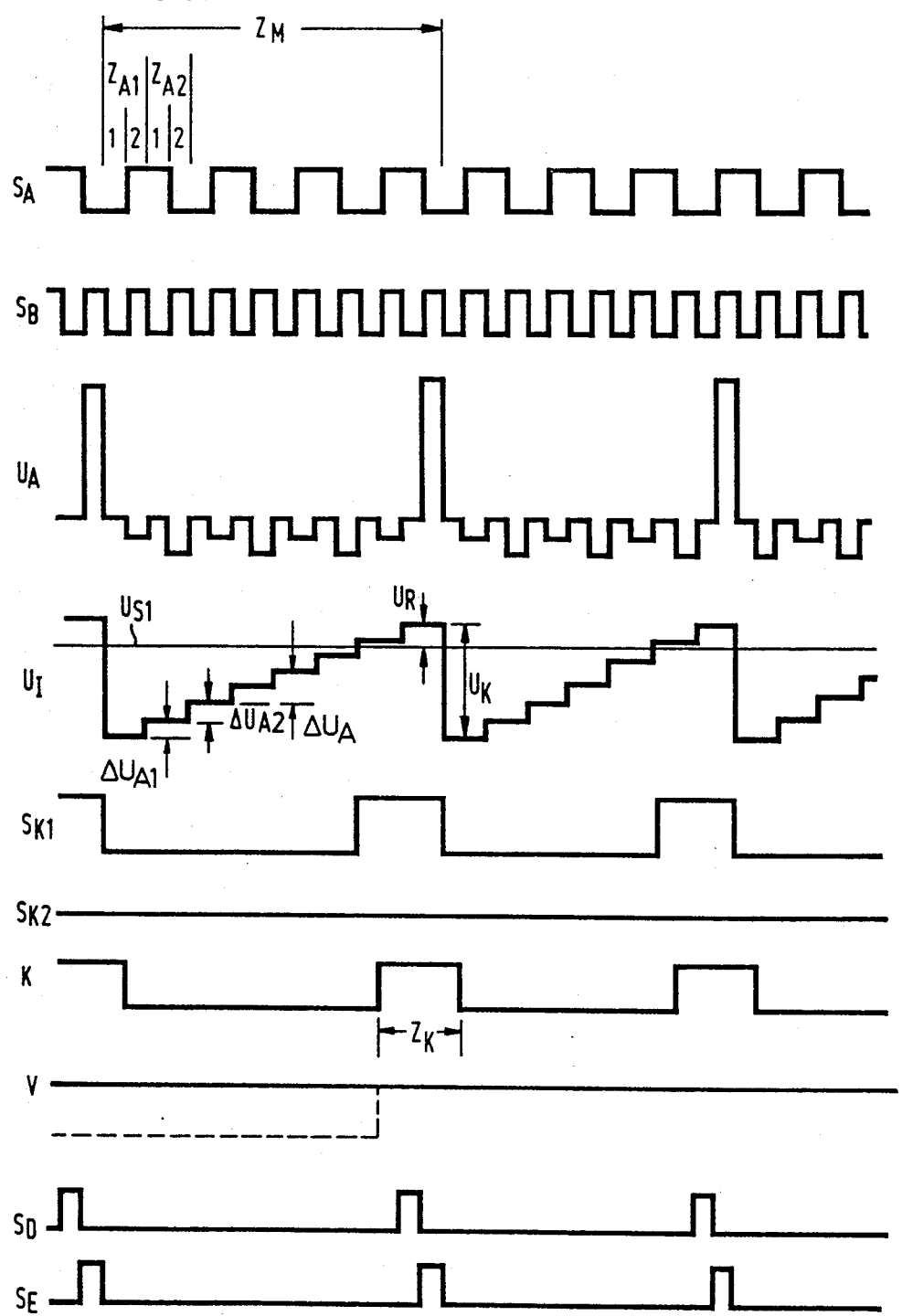

METHOD AND ARRANGEMENT FOR MEASURING THE RESISTANCE RATIO IN A RESISTANCE HALF-BRIDGE

The invention relates to a method for measuring the resistance ratio $\Delta R/R$ in a resistance half-bridge comprising two series-connected resistors whose resistances differ from a common basic resistance R by equal difference resistances $\Delta R$ of opposite sign, the two resistors being traversed by the same current.

Resistance half-bridges of this type are used in particular in measuring forces with the aid of strain gauges which are attached in pairs to a deformable beam in such a manner that they are deformed in opposite senses under the action of a force. To determine the deforming force the ratio $\Delta R/R$ must be determined. This ratio is very small in strain gauges; it may be of the order of magnitude of a few parts per thousand.

According to the prior art the measurement of the resistance ratio $\Delta R/R$ is carried out in a resistance half-bridge of the type stated in that the resistance half-bridge is supplemented with a second resistance half-bridge to form a full bridge and the voltage occurring at the output diagonal due to the bridge unbalance is evaluated. In uses in which the relative resistance changes are very small but high demands are made of the measuring accuracy by means of AC voltage supply, AC voltage amplification and subsequent in-phase rectification the necessary suppression of interfering influences is achieved, such as contact and thermal voltages and the zero-point drifting of the amplifiers, but this requires a great circuit technical expenditure and involved setting and calibration procedures. Furthermore, the bridge supply voltage must be stabilized against external influences.

The problem underlying the invention is the provision of a method which permits a very accurate measurement of the resistance ratio $\Delta R/R$ in a resistance half-bridge with small circuit expenditure, the measurement result being independent of external or circuit-inherent interfering influences, and an arrangement for carrying out the method.

To solve this problem the method according to the invention is characterized in that in successive sampling cycles difference voltages which are proportional to the difference between the voltage drops at the two resistors are integrated to an integration voltage, that every time the integration voltage exceeds an upper threshold value or drops below a lower threshold value in a compensation cycle a compensation voltage directed oppositely to the difference voltage is superimposed on the integration voltage and is proportional to the sum of the voltage drops at the two resistors, and that the ratio of the number of the compensation cycles to the number of sampling cycles is determined as a measure of the resistance ratio $\Delta R/R$.

With the method according to the invention the measurement result is obtained directly in digital form by counting sampling and compensation cycles. In the formation of the sum and difference voltages which determine the number of cycles to be counted interference influences are largely cancelled out so that they do not impair the measurement accuracy.

A particular advantage of the method according to the invention resides in that it permits the use of the switched capacitor technique, also known as SC technology, so that the advantages of this technology are fully utilized. A preferred arrangement for carrying out the method therefore includes according to the invention an integrating SC amplifier with an operational amplifier which in the feedback circuit comprises an integration capacitor, at least one input capacitor and cyclically controlled switches for alternate charging of the or each input capacitor by one of the voltage drops in a clock time of each sampling cycle with charge transport to the integration capacitor and for discharging the or each input capacitor in a further clock time of each sampling cycle with disconnected integration capacitor.

Advantageous further developments and embodiments of the method according to the invention and the arrangement for the execution thereof are set forth in the subsidiary claims.

Figure 2:
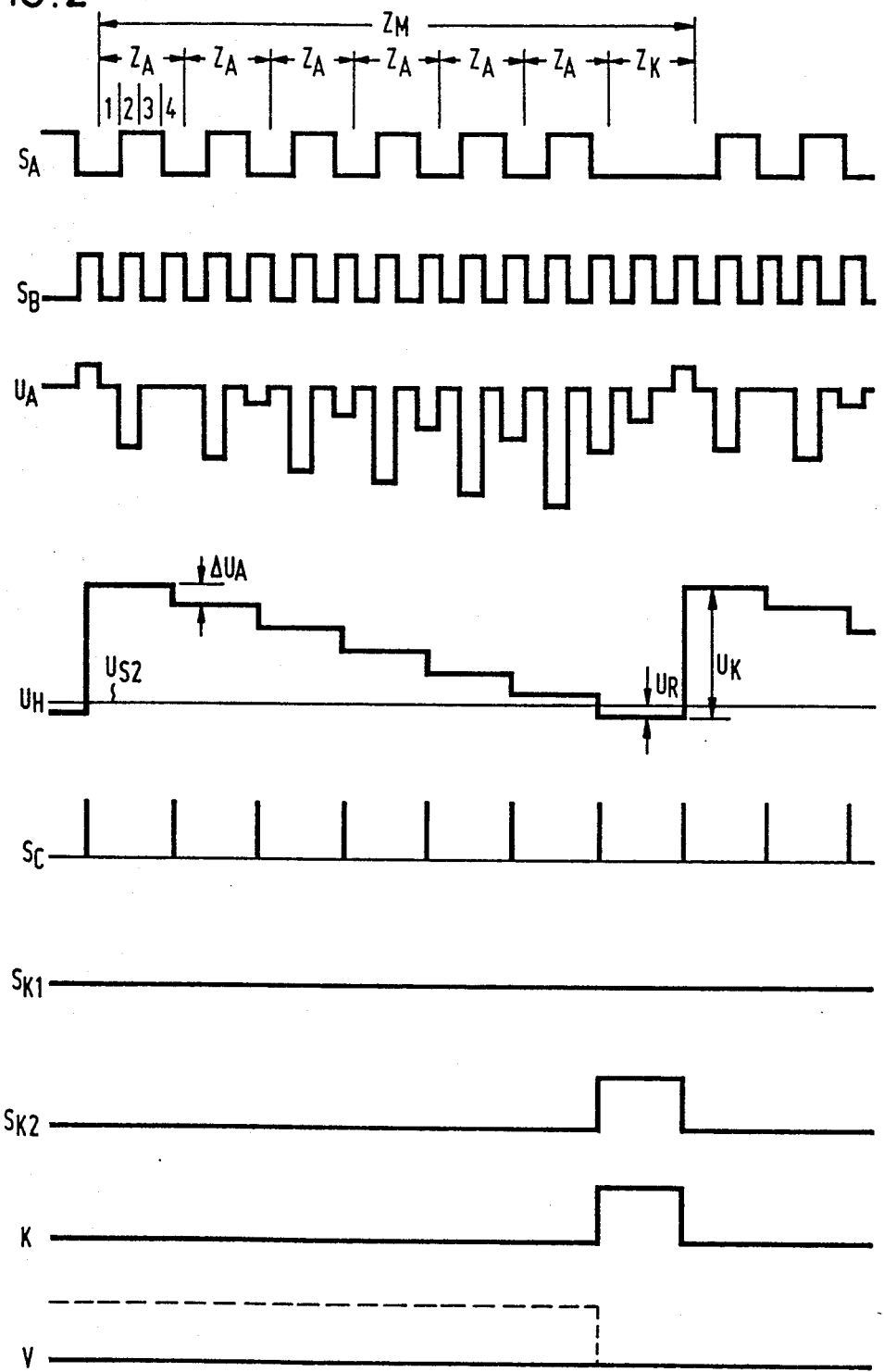
Figure 3:
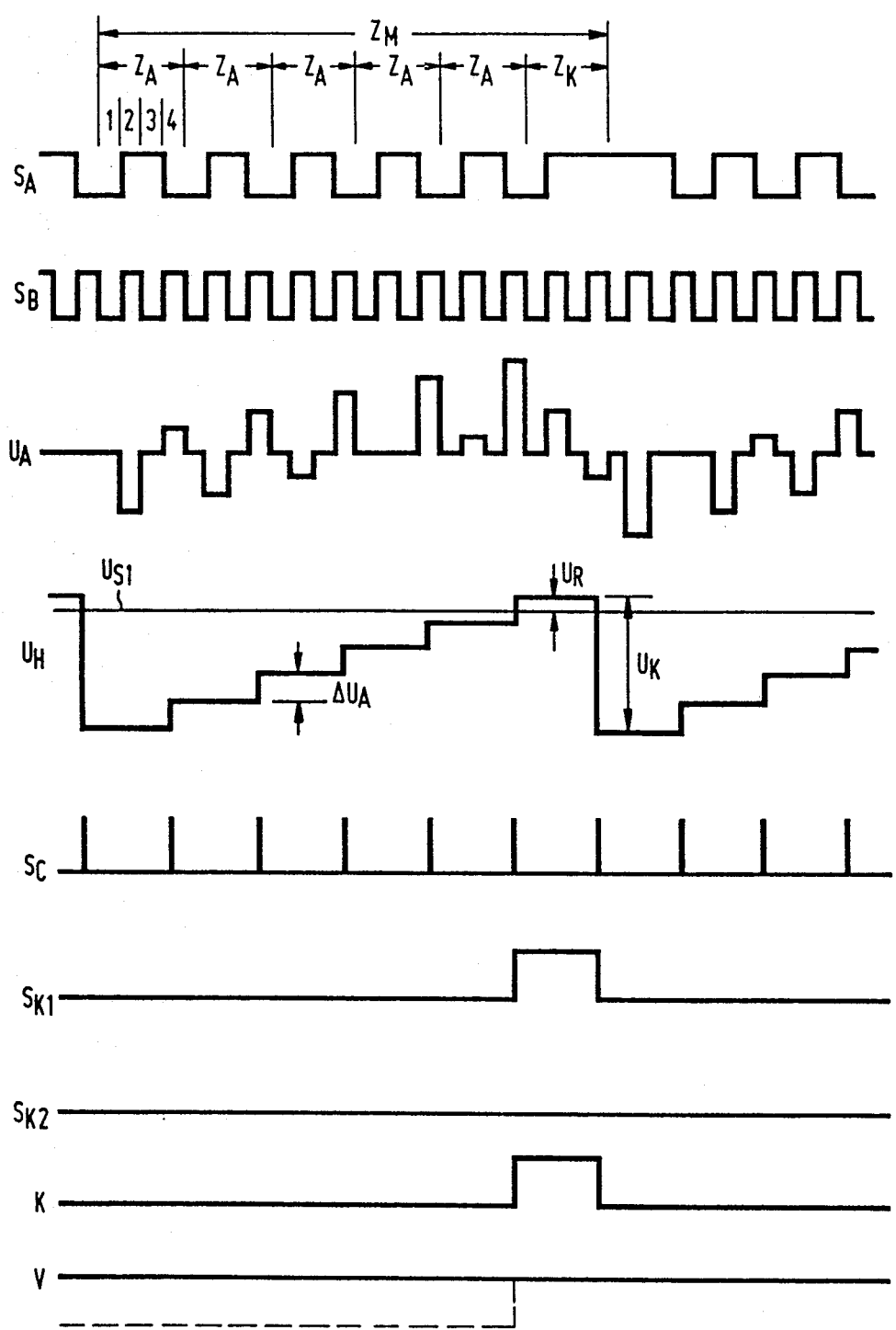
Figure 7:
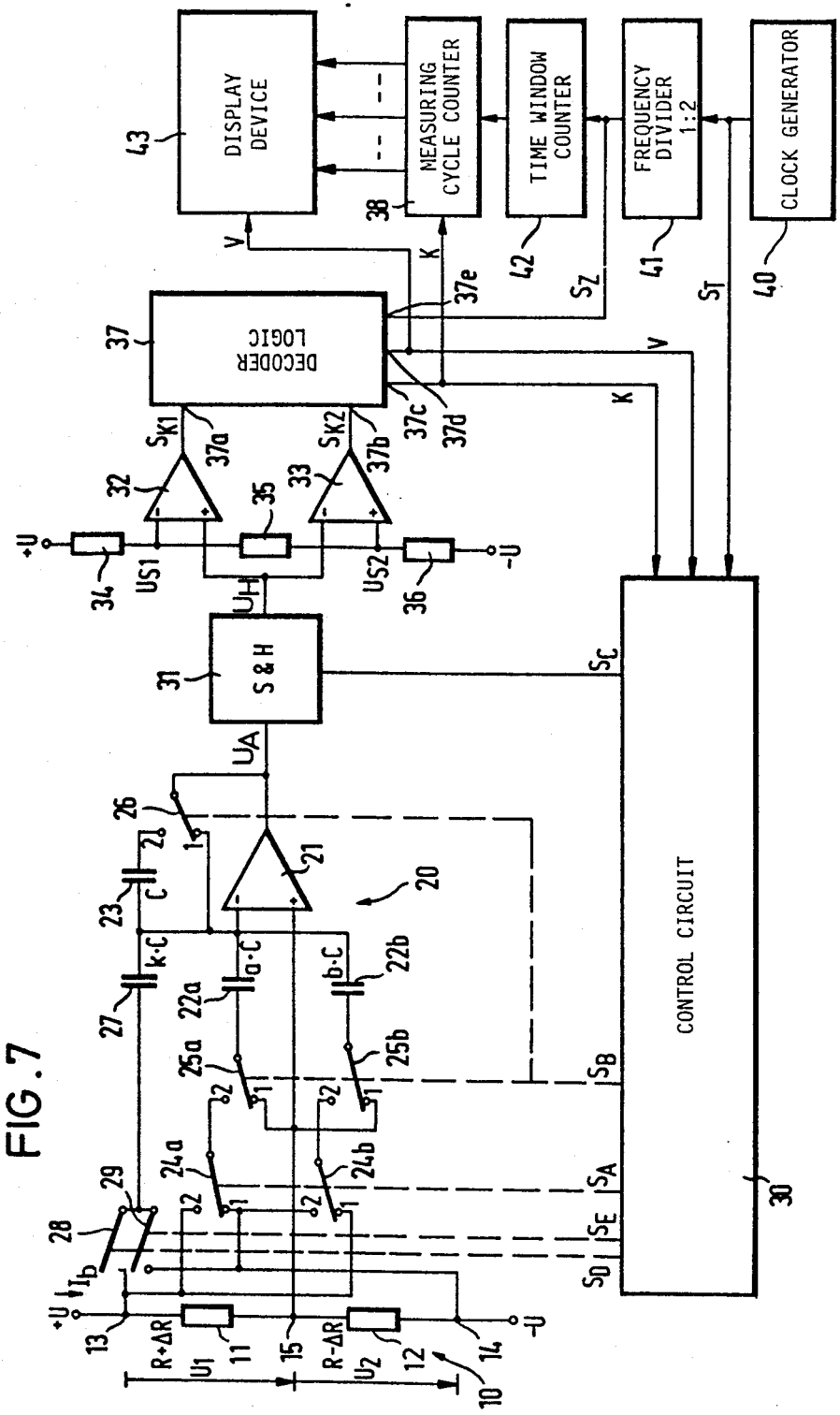
Figure 8:
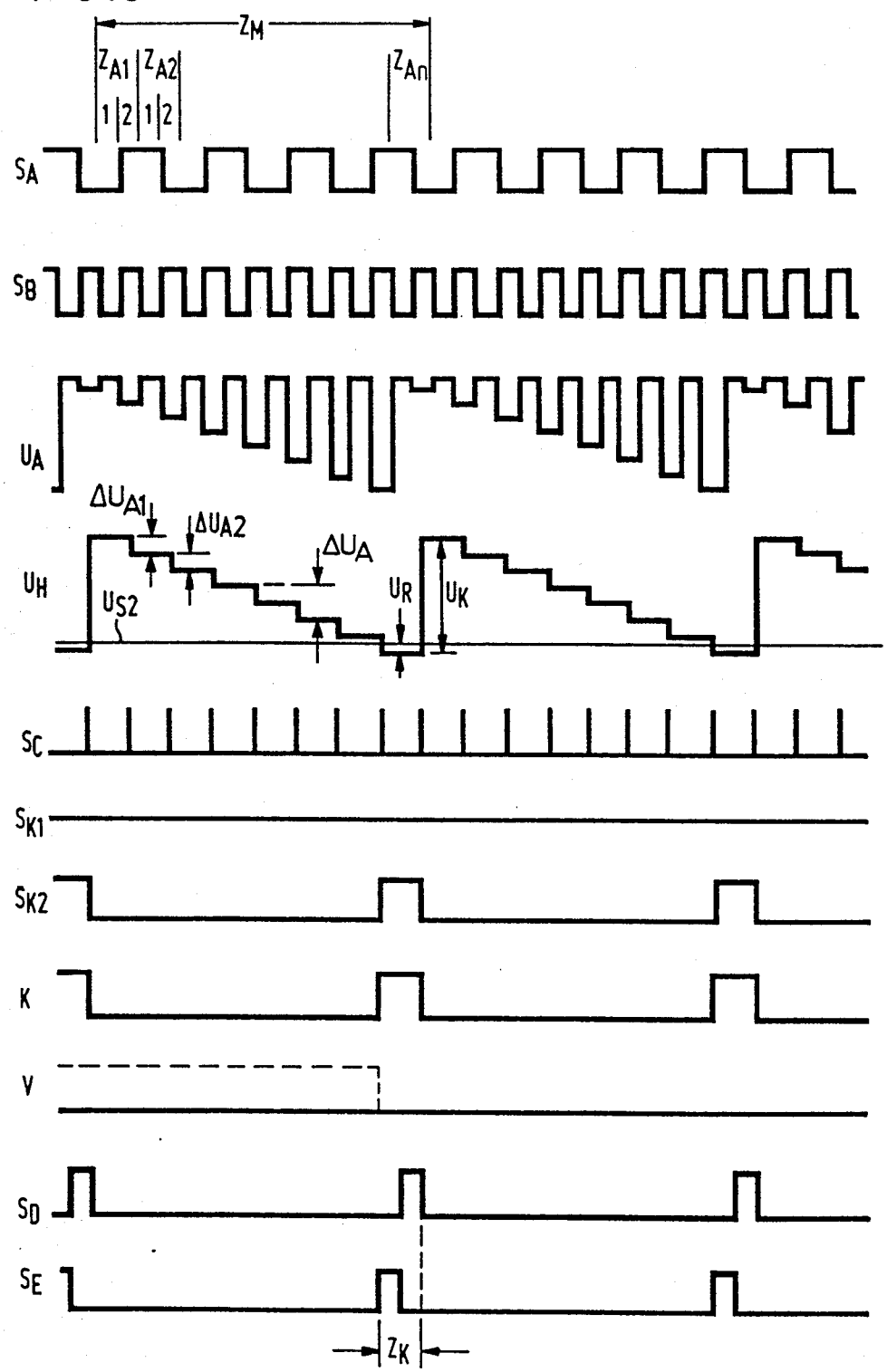
Figure 9:
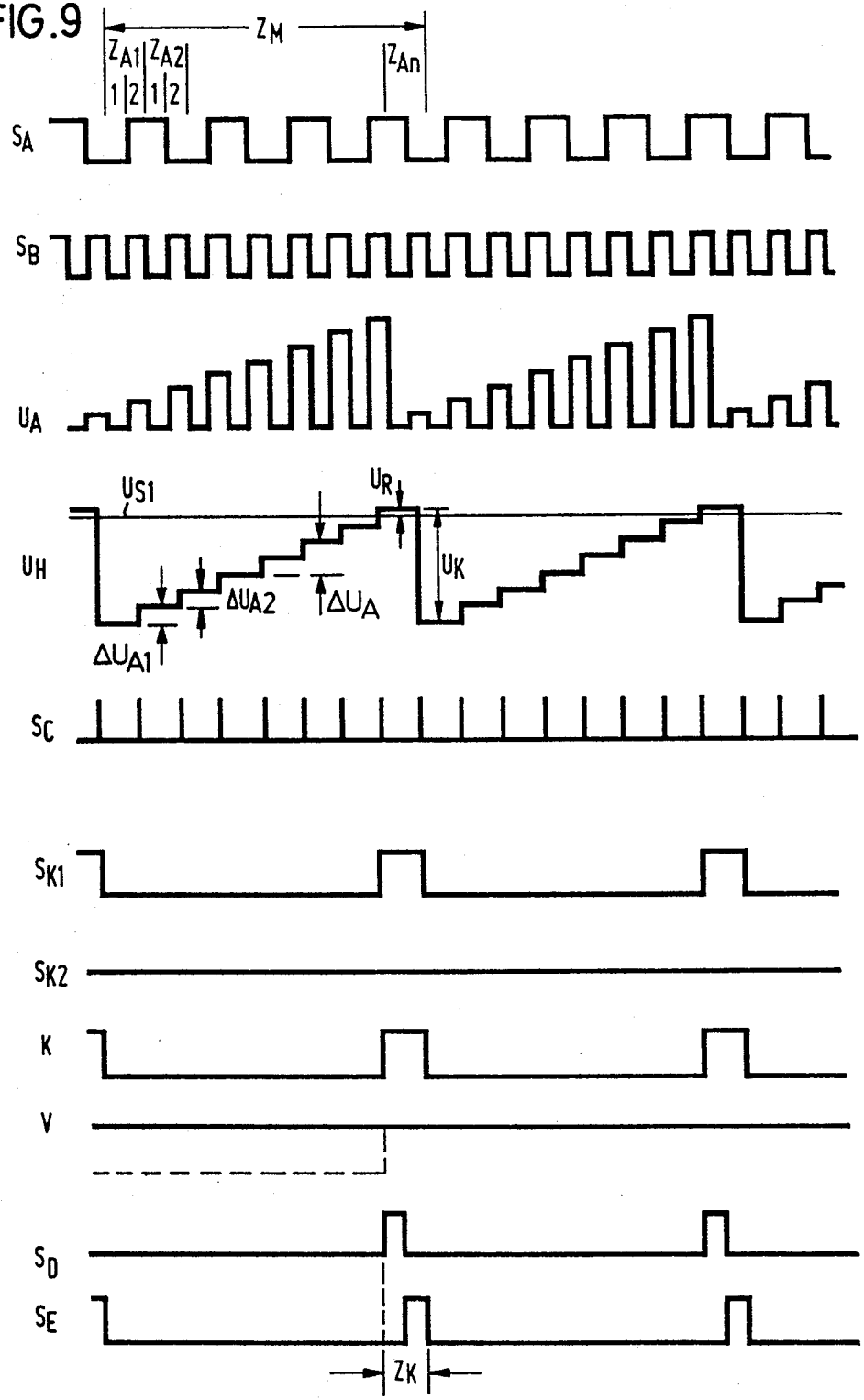
Figure 10:
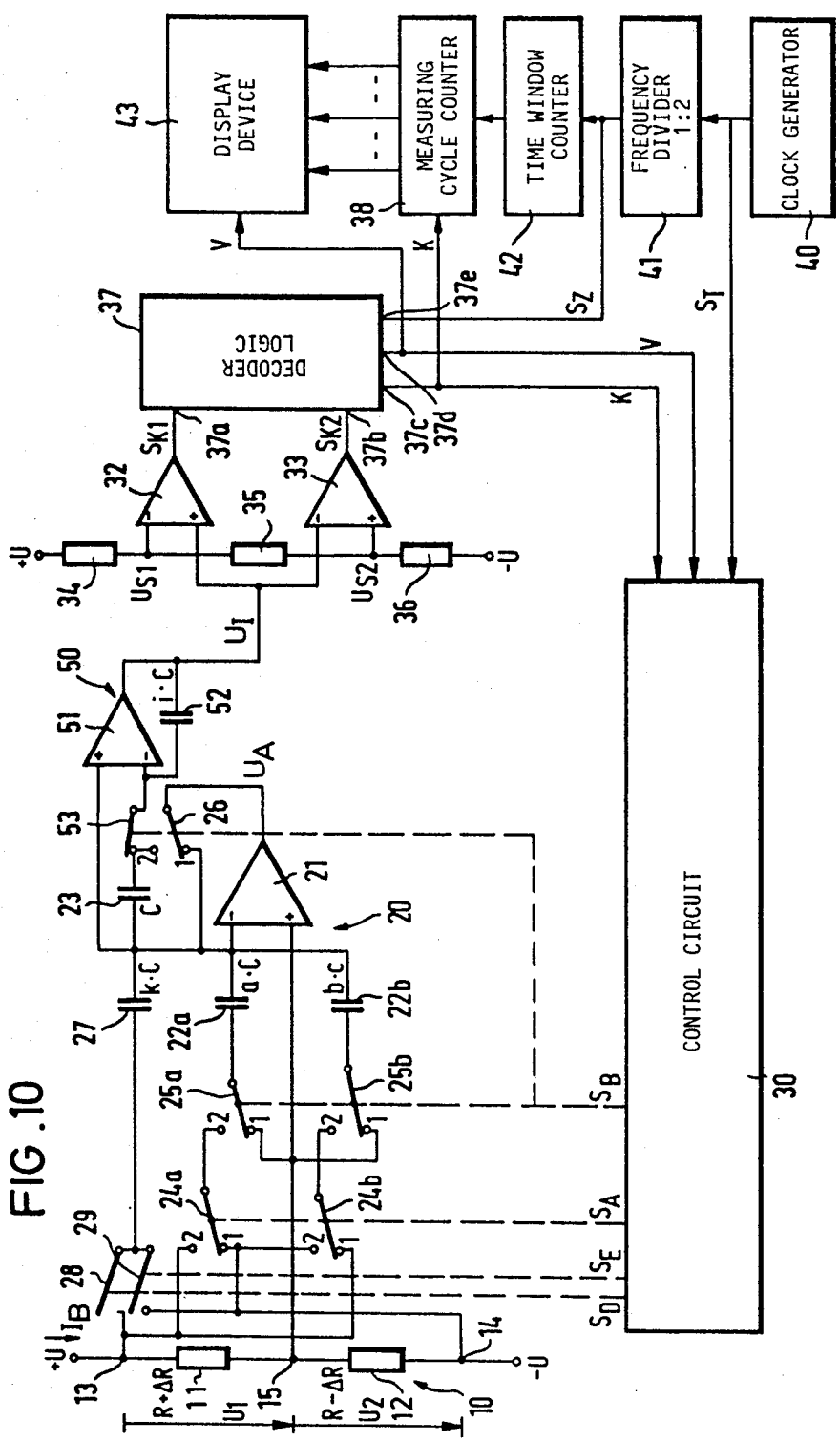

Further features and advantages of the invention will be apparent from the following description of examples of embodiment which are illustrated in the drawings, wherein:

FIG. 1 shows the circuit diagram of a measuring circuit according to the invention, FIGS. 2 and 3 show time diagrams of voltages and signals which occur in the measuring circuit of FIG. 1, FIGS. 4, 5 and 6 are simplified illustrations of the SC amplifier contained in the measuring circuit of FIG. 1 in various states, FIG. 7 is the circuit diagram of another embodiment of the measuring circuit of FIG. 1, FIGS. 8 and 9 time diagrams of voltages and signals which occur in the measuring circuit of FIG. 7, FIG. 10 is the circuit diagram of another embodiment of the measuring circuit of FIG. 7 and FIGS. 11 and 12 are time diagrams of voltages and signals which occur in the measuring circuit of FIG. 10.

FIG. 1 shows a resistance half-bridge 10 having two resistors 11 and 12 connected in series. The resistances of the resistors 11 and 12 differ by the same amounts but with opposite signs from an equal basic value R. As example it is assumed that the resistor 11 has the resistance $R_{11} = R + \Delta R$ and the resistor 12 the resistance $R_{12} = R - \Delta R$. The difference resistance $\Delta R$ can be variable and greater or less than zero. For $\Delta R > 0$ with the selected allocation $R_{11} > R_{12}$ and for $\Delta R < 0$, $R_{11} < R_{12}$.

Resistors of this type occur in particular in the form of strain gauges which are arranged in pairs on a deformable beam in such a manner that they are deformed in opposite senses under the action of force. To measure the deforming force the ratio $\Delta R/R$ must be determined. The measuring circuit illustrated in FIG. 1, at the input of which the resistance half-bridge 10 lies, generates a digital output signal indicating the resistance ratio $\Delta R/R$.

To generate signals which are proportional to the resistances $R_{11} = R + \Delta R$ and $R_{12} = R - \Delta R$ the two outer terminals 13 and 14 of the resistance half-bridge are connected to the two poles $+U$ and $-U$ of a DC voltage source which applies a DC voltage to the resistance half-bridge 10. This DC voltage may for example be the supply DC voltage $U_B$ of the circuit. Via the resistance half-bridge 10 a direct current $I_B$ then flows which is determined by the voltage $U_B$ applied and the total resistance of the half-bridge:

$$I_B = \frac{U_B}{(R + \Delta R) + (R - \Delta R)} = \frac{U_B}{2R} \quad (1)$$

As can be seen, the current $I_B$ is independent of the variable difference resistance $\Delta R$ and is therefore constant.

The current $I_B$ causes at the resistor 11 between the outer terminal 13 and the centre tap 15 of the resistance half-bridge 10 a voltage drop $U_1$ of the value $$U_1 = I_B \cdot (R + \Delta R) = U_B \cdot \frac{(R + \Delta R)}{2R} \quad (2)$$

The same current $I_B$ flows through the resistor 12 and causes at the latter between the centre tap 15 and the outer terminal 14 a voltage drop $U_2$ of the value $$U_2 = I_B \cdot (R - \Delta R) = U_B \cdot \frac{(R - \Delta R)}{2R} \quad (3)$$

The voltages $U_1$ and $U_2$ are thus independent of the absolute value of the current $I_B$.

Furthermore, of course the following relationship holds:

$$U_1 + U_2 = U_B \quad (4)$$

The measuring circuit includes as essential component an integrating switched capacitor amplifier 20, which is also known under the name SC amplifier, which is the term which will be used in the following description.

The SC amplifier is formed by an operational amplifier 21, two capacitors 22, 23 and three switches 24, 25 and 26. The three switches 24, 25 and 26 are shown as mechanical changeover switches with two switch positions; in reality they are highspeed electronic switches, for example MOS field-effect transistors. Since an electronic switch can be operated only as on-off switch each of the changeover switches shown is implemented by two electronic switches. The positions of the three switches illustrated in the drawing are referred to as position 1; the other positions are referred to as position 2.

The non-inverting input of the operational amplifier 21 is permanently connected the centre tap 15 of the resistance half-bridge 10. The variable potential at the centre tap 15 thus represents the "floating" reference potential of the circuit. Connected to the inverting input of the operational amplifier 21 is the one electrode of the capacitor 22 whose other electrode is connected by the switch 25 in the position 1 to the inverting input and the centre tap 15 and in the position 2 to the switch 24. The switch 24 in turn establishes in its position 1 a connection to the outer terminal 14 and in the position 2 a connection to the outer terminal 13.

The capacitor 23 and the switch 26 lie in the feedback circuit of the operational amplifier 21. The one electrode of the capacitor 23 is connected to the inverting input of the operational amplifier 21. The switch 26 represents in its position 1 a direct short-circuit connection from the output of the operational amplifier 21 to the inverting input, the connection to the electrode of the capacitor 23 not connected to the inverting input being interrupted. In the position 2 of the switch 26, in contrast, the short-circuit connection is interrupted and instead a feedback connection is established from the output of the operational amplifier 21 via the capacitor 23 to the inverting input.

The capacitor 23 has the capacitance C. The capacitance of the capacitor 22 differs from the capacitance of the capacitor 23 by the factor a; the capacitor 22 thus has the capacitance a.C.

The switches 24, 25 and 26 are actuated by control signals coming from a control circuit 30. A control signal $S_A$ actuates the switch 24. A control signal $S_B$ actuates the switches 25 and 26 which thus always assume their positions 1 or 2 simultaneously.

Connected to the output of the operational amplifier 21 is an instantaneous value store 31 which is actuated by a control signal $S_C$ coming from the control circuit 30. An instantaneous value store, also known under the name "S & H" ("sample & hold"), samples of course on each control pulse applied to its control input the signal voltage lying at its signal input, stores the sampled value until the next control pulse and makes the stored sampled value available at its output. The sample and hold circuit 31 may also be omitted if the sampling and holding takes place in the digital part of the circuit.

The output of the sample and hold circuit 31 is connected to the signal inputs of two threshold value comparators 32 and 33 which are formed in the example of embodiment illustrated by operational amplifiers with open feedback branch. Applied to the comparison inputs of the threshold value comparators are threshold voltages $U_{S1}$ and $U_{S2}$ respectively which are tapped from the taps of a voltage divider chain formed by three resistors 34, 35 and 36. The threshold voltage $U_{S1}$ is higher than the threshold voltage $U_{S2}$ and is applied to the inverting input of the operational amplifier forming the threshold value comparator 32 and receiving the output voltage $U_H$ of the sample and hold circuit 31 at the non-inverting input. Thus, the output signal $S_{K1}$ of the threshold value comparator 32 changes from the low to the high signal level when the output voltage $U_H$ of the sample and hold memory 31 exceeds the threshold voltage $U_{S1}$. The lower threshold voltage $U_{S2}$ is applied to the non-inverting input of the operational amplifier forming the threshold value comparator 33 and receiving the voltage $U_H$ at its inverting input. Thus, the output signal $S_{K2}$ of the threshold value comparator 33 goes from the low to the high signal level when the voltage $U_H$ drops below the threshold voltage $U_{S2}$.

The outputs of the two threshold value comparators 32 and 33 are connected to the inputs 37a and 37b respectively of a decoder logic 37 which responds to the output signals $S_{K1}$, $S_{K2}$ of the threshold value comparators 32, 33. An output 37c of the decoder logic 37 at which a compensation enable signal K is emitted is connected to an input of the control circuit 30 and to the counting input of a measuring cycle counter 38. A second output 37d of the decoder logic 37 at which a sign signal V is furnished is connected to a further input of the control circuit 30.

A clock generator 40 supplies o the control circuit 30 a clock signal $S_T$ which consists of a clock pulse train with predetermined clock frequency. Said clock pulse train $S_T$ is also supplied to a frequency divider 41 which divides the clock frequency in a predetermined divider ratio which in the example of embodiment illustrated in FIG. 1 is 1:4. The pulse train emitted at the output of the frequency divider 41 with the reduced recurrence frequency is also supplied as counting clock signal $S_Z$ to a time window counter 42 and a clock input 37e of the decoder logic 37. An output of the time window counter 42 is connected to an input of the measuring cycle counter 38.

The outputs of the counter stages of the measuring cycle counter 38 are connected to the inputs of a display device 43. When the measuring cycle counter 38 receives a pulse from the time window counter 42 the count of the measuring cycle counter 38 is transferred to the display device 43 and at the same time the measuring cycle counter is reset to 0. The display device 43 also receives the sign signal V from the output 37d of the decoder logic 37. It displays the count of the measuring cycle counter 38 with the sign defined by the sign signal V.

Figure 4:
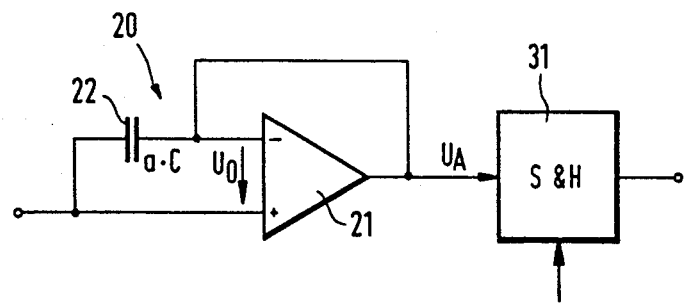
Figure 5:
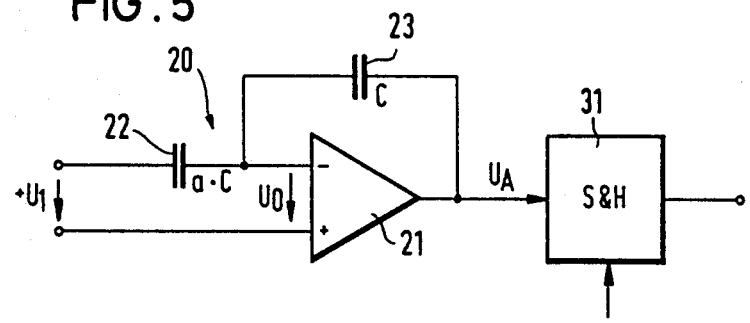
Figure 6:
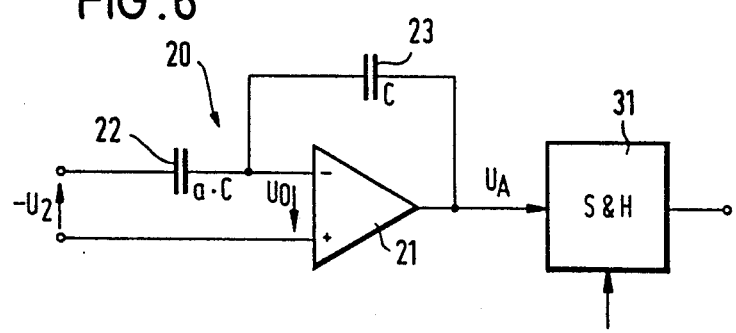

The mode of operation of the circuit of FIG. 1 will be explained with the aid of the diagrams of FIGS. 2 and 3 and the simplified circuit diagrams of FIG. 4 and 5.

The diagrams of FIG. 2 show the time profile of the voltages and signals occurring in the circuit of FIG. 1 for the case where $\Delta R > 0$. In very simplified form a complete measuring cycle $Z_M$ is represented which is made up of a plurality of sampling cycles $Z_A$ and a compensation cycle $Z_K$. The measuring cycles $Z_M$ repeat themselves periodically. Each sampling cycle $Z_A$ is subdivided into four clock times which are illustrated for the first sampling cycle and denoted by 1, 2, 3, 4. The clock times are defined by the clock pulses of the clock signal $S_T$ supplied by the clock generator 40.

The diagrams $S_A$ and $S_B$ show the control signals which actuate the switches 24, 25 and 26. Each switch assumes at the low signal level of the control signal the position 1 and at the high signal level of the control signal the position 2.

In the clock time 1 at the start of the sampling cycle $Z_A$ the two control signals $S_A$ and $S_B$ have the low signal level. The three switches 24, 25, 26 therefore all assume the position 1 illustrated in FIG. 1. For clarification the corresponding state of the SC amplifier 20 is again shown in FIG. 4. It is thereby assumed that between the two inputs of the operational amplifier 21 an offset voltage $U_0$ obtains. Fundamentally, the function of an SC circuit is best described through the transported charges. In the state of FIG. 4 the capacitor 22 is at the offset voltage $U_0$. It therefore takes up the following charge $Q_0$:

$$Q_0 = -U_0 \cdot a \cdot C \quad (5)$$

The clock time 1 thus serves for offset acquisition.

In the clock time 2 the two control signals $S_A$ and $S_B$ assume the high signal level; all the three switches 24, 25 and 26 therefore go to the state 2. The corresponding state of the SC amplifier 20 is illustrated in FIG. 5. In this state the capacitor 23 lies in the feedback circuit of the operational amplifier 21 and the voltage $U_1$ is applied via the capacitor 22 to the operational amplifier 21. This state serves to acquire the voltage $U_1$. At the capacitor 22 the voltage $U_1 - U_0$ is present. It is therefore recharged to the following charge $U_1$:

$$Q_1 = (U_1 - U_0) \cdot a \cdot C \quad (6)$$

The difference charge necessary for this purpose is $$\Delta Q_1 = Q_1 - Q_0 = (U_1 - U_0) \cdot a \cdot C + U_0 \cdot a \cdot C = -U_1 \cdot a \cdot C \quad (7)$$

This difference charge $Q_1$ is thus independent of the offset voltage $U_0$. It must be supplied by the capacitor 23. Accordingly, the voltage $U_A$ at the capacitor 23, simultaneously representing the output voltage of the operational amplifier 21, changes by the amount $$\Delta U_A = \frac{\Delta Q_1}{C} = -\frac{U_1 \cdot a \cdot C}{C} = -a \cdot U_1 \quad (8)$$

This voltage jump can be seen in the diagram $U_A$ of FIG. 2.

In the clock time 3 the control signal $S_B$ again assumes the low signal level so that the two switches 25 and 26 return to position 1. The switch 24 remains in position 2 but this is of no significance because it is disconnected by the switch 25. The SC circuit thus has again the state of FIG. 4. An offset acquisition again takes place, the capacitor 22 being recharged to the charge $$Q_0 = -U_0 \cdot a \cdot C \quad (5)$$

The charge of the capacitor 23 remains unchanged. The output voltage $U_A$ again returns to the reference potential at the centre tap 15 except for the offset voltage $U_0$.

Finally, in the clock time 4 the control signal $S_A$ changes to the low signal level whilst at the same time the control signal $S_B$ again assumes the high signal level. The SC amplifier 20 has thus assumed the state of FIG. 6 which is identical to the state of FIG. 5 with the difference however that instead of the voltage $U_1$ the voltage $-U_2$ is now applied via the capacitor 22 to the inputs of the operational amplifier 21. This clock time thus serves to acquire the input voltage $-U_2$. The capacitor 22 is recharged to $$Q_2 = (-U_2 - U_0) \cdot a \cdot C \quad (9)$$

The difference charge necessary for this is $$\Delta Q_2 = Q_2 - Q_0 = (-U_2 - U_0) \cdot a \cdot C + U_0 \cdot a \cdot C = -U_2 \cdot a \cdot C \quad (10)$$

This difference charge is again independent of the offset voltage $U_0$ and must be supplied by the capacitor 23. Thus, altogether the charge of the capacitor 23 in the course of the sampling cycle $Z_A$ has changed by the following difference charge:

$$\Delta Q = \Delta Q_1 + \Delta Q_2 = -U_1 \cdot a \cdot C + U_2 \cdot a \cdot C = -(U_1 - U_2) \cdot a \cdot C \quad (11)$$

Accordingly, the output voltage $U_A$ has changed in the course of the sampling cycle $Z_A$ altogether by the following difference voltage $\Delta U_A$:

$$\Delta U_A = \frac{\Delta Q}{C} = \frac{-(U_1 - U_2) \cdot a \cdot C}{C} = -a \cdot (U_1 - U_2) \quad (12)$$

It should be observed here that once again the offset voltage has no influence whatever.

At the end of the sampling cycle $Z_A$ in the control signal $S_C$ a short pulse appears which initiates a sample and hold operation in the sample and hold circuit 31. The sample and hold circuit 31 samples the new value of the output voltage $U_A$ which appears at the output of the sample and hold circuit 31 until the end of the next sampling cycle. The output voltage $U_H$ of the sample and hold circuit 31 thus changes at the end of the sampling cycle $Z_A$ by the amount $\Delta U_A$ compared with the previously stored value. Since the voltage change is negative the voltage $U_H$ becomes smaller by this amount.

The same operation is repeated in each following sampling cycle $Z_A$ so that the voltage $U_H$ becomes smaller in the manner of a descending step curve as shown by diagram $U_H$ of FIG. 2. This voltage $U_H$ changing in staircase manner is continuously compared in the threshold value comparators 32 and 33 with the two threshold voltages $U_{S1}$ and $U_{S2}$ but the decoder logic 37 does not respond as long as the voltage $U_H$ lies between the two threshold voltages $U_{S1}$ and $U_{S2}$.

In diagram $U_H$ of FIG. 2 the instant can be seen at which the voltage $U_H$ drops below the threshold voltage $U_{S2}$ at the end of a sampling cycle $Z_A$. This dropping below results in the output signal $S_{K2}$ of the threshold value comparator 33 assuming the high signal level as apparent in diagram $S_{K2}$ of FIG. 2. This signal is supplied to the decoder logic 37 which thereupon furnishes at the output 37c a compensation enable signal K which permits the execution of a compensation cycle.

The sign signal V emitted at the output 37d of the decoder logic 37 assumes the low signal level when the threshold value comparator 33 by the signal $S_{K2}$ shows that the voltage has dropped below the threshold voltage $U_{S2}$ whilst it assumes the high signal level when the threshold value comparator 32 by the signal $S_{K1}$ indicates that the threshold value $U_{S1}$ has been exceeded. Thus, if the sign value V in the preceding measuring cycle because the voltage was below the threshold voltage $U_{S2}$ had assumed that low signal level it retains this signal level in the current measuring cycle $Z_M$ as illustrated in diagram V of FIG. 2 by a full line. If however in the preceding measuring cycle the sign signal V had the high signal level because the higher threshold voltage $U_{S1}$ was exceeded the signal level of the sign signal V changes with the rising edge of the compensation enable signal K as illustrated in FIG. 2 by a dashed line.

In the compensation cycle $Z_K$ the step voltage changes in the preceding sampling cycles $Z_A$ are compensated by a compensation voltage $U_K$. For this purpose the charge $$-Q_K = -(U_1 + U_2) \cdot a \cdot C \qquad (13)$$

is additionally transferred. This leads to a change of the voltage $U_A$ by the compensation voltage $$+U_K = +(U_1 + U_2) \cdot a \qquad (14)$$

Expediently, a sampling cycle is combined with the combination cycle. In this combined cycle the following total charge $Q_G$ must therefore be transferred:

$$Q_G = \Delta Q - Q_K = (U_1 - U_2) \cdot a \cdot C - (U_1 + U_2) \cdot a \cdot C = -2 U_2 \cdot a \cdot C \qquad (15)$$

The compensation can thus take place in simple manner by detecting the voltage $U_2$ twice in a sampling cycle. For this purpose it is only necessary for the switch 24 to be in the position 1 also in the clock time 2 of the compensation cycle. As the diagram $S_A$ of FIG. 2 shows the control signal $S_A$ thus remains during the entire compensation cycle $Z_K$ on the low signal level. This combination of the compensation cycle with a sampling cycle is very advantageous because the charge $Q_K$ alone could not be acquired without further expenditure but the two samplings of the voltage $U_2$ are effected in any case free from error.

With the compensation cycle $Z_K$ the measuring cycle $Z_M$ is completed. In the next measuring cycle the voltage $U_H$ again decreases in staircase manner from the initial value reached by the compensation voltage $U_K$ until it again drops below the threshold voltage $U_{S2}$.

The number of sampling cycles necessary until the compensation voltage $U_K$ is cancelled again by the voltage steps $\Delta U_A$ is $$n = \frac{U_k}{\Delta U_A} = \frac{(U_1 + U_2) \cdot a}{(U_1 - U_2) \cdot a} = \frac{U_1 + U_2}{U_1 - U_2} \qquad (16)$$

Now:

$$U_1 + U_2 = i_B \cdot (R + \Delta R) + i_B \cdot (R - \Delta R) = 2 i_B \cdot R \qquad (17)$$

$$U_1 - U_2 = i_B \cdot (R + \Delta R) - i_B \cdot (R - \Delta R) = 2 i_B \cdot \Delta R \qquad (18)$$

From whence:

$$n = \frac{U_1 + U_2}{U_1 - U_2} = \frac{2 i_B \cdot R}{2 i_B \cdot \Delta R} = \frac{R}{\Delta R} \qquad (19)$$

The number of sampling cycles in a measuring cycle is thus a direct measure of the desired resistance ratio $\Delta R/R$. By the simultaneous utilization of a cycle for sampling and compensation an error of unity in the counting of the cycles is avoided.

It should be observed with regard to the measuring accuracy obtained that in the compensation the residual charges corresponding to the exceeding of the threshold voltages or the residual voltages corresponding to said residual charges are retained. In the diagram $U_H$ of FIG. 2 the residual voltage $U_R$ is shown. The stepped curve thus starts in the consecutive measuring cycles at different voltage levels this in turn resulting in a change in the residual voltage $U_R$ remaining at the end of each measuring cycle. As soon as the residual voltage $U_R$ in a measuring cycle is equal to the difference voltage $\Delta U_A$ the number of the sampling cycles in this measuring cycle changes by unity. For example, the value $R/\Delta R = 5.1$ would lead in the following measuring cycles to the following numerical values:

n = 5, 5, 5, 5, 5, 5, 5, 5, 6, 5, 5 . . .

Thus by averaging the numerical values over a larger number of measuring cycles a more exact measuring result is obtained. The measuring accuracy is greater the greater the number of measuring cycles counted.

In reality in the areas of use of the measuring cycles which occur in practice the ratio $\Delta R/R$ is very much smaller than the above numerical example, which was chosen only for the explanation. Thus, with strain gauges, for which the measuring cycle is primarily intended, the relative resistance changes $\Delta R/R$ occurring are in the parts per thousand range. The number n of the sampling cycles per measuring cycle is thus of the order of magnitude of 1000.

Instead of counting the sampling cycles per measuring cycle it is more convenient to count the measuring cycles in a time window which corresponds to a predetermined very large number of sampling cycles. For k measuring cycles in accordance with equation (19) the number m of the sampling cycles is:

$$m = k \cdot n = k \cdot \frac{R}{\Delta R} \qquad (20)$$

In a time window corresponding to a predetermined number m of sampling cycles the number k of the measuring cycles is therefore $$k = \frac{\Delta R}{R} \cdot m \quad (21)$$

from whence:

$$\frac{\Delta R}{R} = \frac{k}{m} \quad (22)$$

The desired value $\Delta R/R$ is therefore directly proportional to the count k reached in the time window.

Preferably, the number m is made equal to a power of ten. The count k is then the decimal numerical value of the desired ratio $\Delta R/R$, apart from the exponent of the power of ten.

If for example a time window is chosen which corresponds to $m = 10^6$ sampling cycles then for the ratio $\Delta R/R$:

$$\frac{\Delta R}{R} = \frac{k}{m} = k \cdot 10^{-6} \quad (23)$$

The counting arrangement shown in FIG. 1 following the decoder logic 37 and the clock generator 40 determines the measured value $\Delta R/R$ by this principle. The counting clock pulses $S_Z$ furnished by the output of the frequency divider 41 have the recurrence frequency of the sampling cycles so that corresponding to each sampling cycle there is a counting clock pulse. The time window counter 42 counts the counting clock pulses $S_Z$ and thus the sampling cycles. It is set so that each time it has counted a predetermined number of m counting clock pulses $S_Z$ it applies a pulse to the measuring cycle counter 38. The number m defines the duration of the time window and has for example the previously given value of $10^6$.

The measuring cycle counter 38 counts the compensation enable signals K emitted by the output 37c of the decoder logic 37. This is equivalent to counting the measuring cycles because at the end of each measuring cycle a compensation enable signal is generated.

At the end of each time window of m sampling cycles the pulse applied by the time window counter 42 to the measuring cycle counter 38 causes the count k reached in the course of the time window to be transferred to the display device 43. At the same time the measuring cycle counter 38 is reset so that in the following time window it again starts to count the measuring cycles from zero onwards. If the transferred count k is displayed in the display device 42 in decimal form and the point is set at the position defined by the factor m, the numerical value of the ratio $\Delta R/R$ can be read directly from the display device. Due to the sign signal V supplied to the display device 43 it is additionally shown whether this ratio is positive or negative. As explained above, dropping below the threshold value $U_{S2}$ defines the positive sign of $\Delta R$.

The diagrams of FIG. 3 show the voltages and signals occurring in the circuit of FIG. 1 for the case $\Delta R < 0$. There are only the following differences from the diagram of FIG. 2:

The difference voltage $\Delta U_A$ is positive so that the staircase output voltage $U_H$ of the sample and hold circuit 31 is ascending;

the compensation cycle is initiated by the threshold value comparator 32 when the voltage $U_H$ exceeds the threshold voltage $U_{S1}$;

the sign signal S goes with the rising edge of the compensation enable signal K to the high signal level indicating the negative sign if it did not already have this signal level beforehand;

due to the sign signal V applied to the control circuit 30, in the combined combination and sampling cycle $Z_K$ the control signal $S_A$ is also held at the high signal level in the clock time 4 so that the voltage $U_1$ is sampled twice in succession.

It is readily apparent that as regards the determination of the ratio $\Delta R/R$ by counting the sampling cycles and measuring cycles this does not result in any change compared with the case previously explained.

FIG. 7 shows a modified embodiment of the measuring circuit of FIG. 1 and FIGS. 8 and 9 show the associated diagrams of the voltages and signals for the cases $\Delta R > 0$ or $\Delta R < 0$ corresponding to the diagrams of FIGS. 2 and 3. The circuit of FIG. 7 differs from that of FIG. 1 only as regards the formation of the SC amplifier 20. There are the following diffrences:

1. Instead of the capacitor 22 two capacitors 22a, 22b are provided and an electrode of each of them is connected to the inverting input of the operational amplifier 21.

2. Instead of the switch 25 two switches 25a, 25b are provided which are jointly actuated by the control signal $S_B$. Each switch 25a, 25b connects the associated capacitor 22a, 22b in the position 1 to the reference potential at the non-inverting input and in position 2 to the associated switch 24a or 24b.

3. Instead of the switch 24 two switches 24a, 24b are provided which are jointly actuated by the control signal $S_A$ The switch 24a, like the switch 24 of FIG. 1, establishes in position 1 a connection to the outer terminal 14 and in position 2 a connection to the outer terminal 13. In contrast the switch 24b in the position 1 establishes a connection to the outer terminal 13 and in the position 2 a connection to the outer terminal 14.

4. An additional capacitor 27 is provided of which one electrode is connected to the inverting input of the operational amplifier 21. A switch 28 connects in the closed position the capacitor 27 to the outer terminal 13 and a switch 29 connects in the closed position the capacitor 27 to the outer terminal 14. The control circuit 30 furnishes a control signal $S_D$ for actuating the switch 28 and a control signal $S_E$ for actuating the switch 29.

5. The division ratio of the frequency divider 41 is now 1:2 instead of 1:4.

All the other circuit components have the same makeup and same mode of operation as in the circuit of FIG. 1. They are therefore denoted by the same reference numerals as therein and will not be described again.

If the capacitor 23, as in FIG. 1, has the capacitance C the capacitor 22a can have the capacitance a·C and the capacitor 22b the capacitance b·C. The capacitor 27 has the capacitance k·C.

As the diagrams of FIGS. 8 and 9 show for two successive sampling cycles $Z_{A1}$ and $Z_{A2}$ due to the duplication of the capacitors 22a, 22b and the switches 24a, 24b and 25a, 25b each sampling cycle $Z_A$ now has only two clock times 1 and 2. In the clock time 1 of each sampling cycle $Z_A$ the two switches 25a and 25b assume the position 1 so that the two capacitors 22a and 22b are applied to the offset voltage $U_0$. This clock time serves for the offset acquisition at the two capacitors.

In the clock time 2 of the sampling cycle $Z_{A1}$ the switches 24a, 24b have the position 2 and the switches 25a, 25b the position 2. As a result the capacitor 22a is charged to the voltage $+U_1$ and the capacitor 22b to the voltage $-U_2$. The acquisition of the two voltages $U_1$ and $U_2$ is thus simultaneously in one clock time. The capacitor 23 furnishes the difference charge necessary for this purpose $$\Delta Q_1 = a \cdot C \cdot U_1 - b \cdot C \cdot U_2 \tag{24}$$

The output voltage $U_A$ changes by a corresponding difference voltage $\Delta U_{A1}$ and is sampled in the sample and hold circuit 31. In the clock time 1 of the sampling cycle $Z_{A2}$ an offset acquisition again takes place and in the clock time 2 of the sampling cycle $Z_{A2}$ the voltage $U_1$ and $U_2$ are again simultaneously acquired. In this clock time 2 however the switches 24a and 24b are position 1 so that the parts played by the capacitors 22a and 22b are interchanged: the capacitor 22a is now charged to the voltage $-U_2$ and the capacitor 22b to the voltage $U_1$. The capacitor 23 furnishes the difference charge necessary for this purpose:

$$\Delta Q_2 = b \cdot c \cdot U_1 - a \cdot C \cdot U_2 \tag{25}$$

The output voltage $U_A$ changes by a corresponding difference voltage $\Delta U_{A2}$ and is sampled in the sample and hold circuit 31.

Thus, the following equation applies after two complete sampling cycles:

$$\Delta Q = \Delta Q_1 + \Delta Q_2 = (a \cdot C \cdot U_1 - b \cdot C \cdot U_2) + (b \cdot C \cdot U_1 - a \cdot C \cdot U_2) = (a+b) \cdot (U_1 - U_2) \cdot C \tag{26}$$

Thus, due to the interchanging of the capacitors 22a and 22b in two consecutive sampling cycles errors due to an inequality of the factors a and b cancel each other out. Nevertheless, these two factors and thus the capacitances of the capacitors 22a and 22b should as far as possible be of equal magnitude so that no unnecessary voltage jumps occur from sampling cycle to sampling cycle. Such voltage jumps would restrict a higher amplification for the difference voltage in conjunction with the restricted dynamic range of the operational amplifier.

The sampling cycles described with cyclic interchange of the capacitors 22a and 22b repeat themselves until the output voltage $U_H$ of the sample and hold memory 31 either in the descending direction drops below the threshold voltage $U_{S2}$ (FIG. 8) or in the ascending direction exceeds the threshold voltage $U_{S1}$ (FIG. 9).

At this instant the decoder logic 37 again emits a compensation enable signal K. This does not however influence the course of the following sampling cycle $Z_{An}$; the acquisition of the voltages $U_1$ and $U_2$ in the capacitors 22a and 22b takes place unchanged in the manner previously described.

At the same time however by means of the capacitor 27 and the switch 28, 29 a compensation cycle $Z_K$ is executed in which the sum voltage $U_1 + U_2$ is separately acquired. The compensation cycle $Z_K$ also consists of two clock times 1 and 2. In the clock time 1 the control signal $S_E$ assumes the high signal level so that the switch 28 is closed. The capacitor 27 is thereby charged to the voltage $-U_2 - U_0$ during the offset acquisition, i.e. with the capacitor 23 disconnected. In the clock time 2 of the compensation cycle $Z_K$ the control signal $S_D$ assumes the high signal level so that the switch 29 is closed whilst the switch 28 is again open. As a result the capacitor 27 is recharged to the following voltage $$(U_1 - U_0) - (U_2 - U_0) = U_1 + U_2 \tag{27}$$

The compensation charge necessary for this $$Q_K = (U_1 + U_2) \cdot K \tag{29}$$

is supplied by the capacitor 23. Accordingly, the output voltage $U_A$ changes by the compensation voltage $$U_K = (U_1 + U_2) \cdot k \tag{29}$$

The number n of the sampling cycles necessary to cancel out the compensation voltage again is $$n = \frac{2 \cdot (U_1 + U_2) \cdot k \cdot C}{(U_1 - U_2) \cdot (a+b) \cdot C} = \frac{2 \cdot k \cdot R}{(a+b) \cdot \Delta R} \tag{30}$$

The factor 2 is obtained from the arithmetic mean of two consecutive sampling cycles.

Thus, in the measuring circuit of FIG. 7 as well the number n of the sampling cycles per measuring cycle is a measure of the ratio $\Delta R/R$ and in particular the number of measuring cycles in a time window corresponding to a large number of sampling cycles is again proportional to the ratio $\Delta R/R$. Thus, as before the measurement result can be obtained directly by counting and display by means of the arrangement already described. As in the case of FIG. 1, the measurement result is independent of external influencing parameters.

The measuring circuit of FIG. 2 also permits by choosing $$(a+b) < 2k \tag{31}$$

an amplification of the difference voltage $\Delta U_A$ and thus considerably shorter counting times.

FIG. 10 shows a further embodiment of the circuit of FIG. 7 and FIGS. 11 and 12 show the associated diagrams of the voltages and signals for the cases $\Delta R > 0$ or $\Delta R < 0$. The circuit of FIG. 10 differs from that of FIG. 7 only in that instead of the sample and hold circuit 31 an integrator 50 is provided. The integrator 50 consists of an operational amplifier 51 in the feedback circuit of which a capacitor 52 with the capacitance $i \cdot C$ lies. Furthermore, a switch 53 is provided which by the control signal $S_B$ is actuated synchronously with the switch 26 so that it remains closed when the switch 26 is in position 1 whereas it is open when the switch 26 is in position 2. In the closed position the switch 53 connects the free electrode of the capacitor 23 to the inverting input of the operational amplifier 51. The non-inverting input of the operational amplifier 21 is permanently connected to the other electrode fo the capacitor 23.

All the remaining circuit components of the circuit of FIG. 10 have the same structure and same mode of operation as the circuit of FIG. 7. They are therefore provided with the same reference numerals as in the latter Figure and will not be described again.

The sampling and compensation cycles are executed in the same manner as in the circuit of FIG. 7. As before, in each sampling cycle the charges from the capacitors 22a and 22b and additionally in each compensation cycle the charge of the capacitor 27 is transferred to the capacitor 23 and after the end of each cycle the capacitor 23 is separated by the switch 26 from the output of the amplifier 21. In this state it is assumed to be charged to the voltage $U_C$. If now the switch 53 is closed the capacitor 23 discharges to the capacitor 52. At the end of the discharging operation it has the offset voltage $U_{02}$ of the amplifier 51. The voltage at the capacitor 52 has changed by the value $$\Delta U_1 = \frac{U_C - U_{02}}{i} \qquad (32)$$

This operation is repeated for each new sampling cycle. Since the following chargings of the capacitor 23 with the charges of the capacitors 22a, 22b and possibly 27 are added in each case to the residual charge $U_{02} \cdot C$, the charge transfer to the capacitor 52 takes place without any influence of the offset voltage $U_{02}$ of the amplifier 51.

The integration voltage $U_I$ at the capacitor 52 which at the same time forms the output voltage of the integrator 50 changes in each sampling cycle by a difference voltage $\Delta U_I$ so that it has the staircase profile shown in diagram $U_I$ of FIGS. 11 and 12 which in this case descends for $\Delta R < 0$ (FIG. 11) and ascends for $\Delta R > 0$. The voltage $U_I$ thus has the same variation as the voltage $U_H$ in the circuits of FIG. 1 and FIG. 7. The voltage $U_I$ can therefore be applied directly to the signal inputs of the threshold value comparators 32 and 33 without a sample and hold circuit being necessary.

It is apparent from the diagrams $U_A$ and $U_I$ of FIGS. 11 and 12 that the two amplifiers 21 and 51 need no longer execute at their outputs the large voltage jumps which occurred in the two circuits of FIGS. 1 and 7. Large voltage changes still occur of course in the compensation cycles. The output voltage $U_A$ of the amplifier 21 changes in the other sampling cycles only between the reference level and the difference voltage $\Delta U_A$. The alternately different values of the difference voltage $\Delta U_A$ illustrated in the diagrams result from the difference between the factors a and b.

The elimination of the continuous large voltage drops provides a considerable saving in current. Also, the requirements of the slew rate of the amplifiers are not as high.

I claim:

1. Method for measuring the resistance ratio $\Delta R/R$ in a resistance half-bridge comprising two series-connected resistors whose resistances differ from a common basic resistance R by equal difference resistances $\Delta R$ of opposite sign, the two resistors being traversed by the same current comprising the steps of integrating in successive sampling cycles difference voltages which are proportional to the difference between the voltage drops at the two resistors to an integration voltage, superimposing on the integration voltage a compensation voltage directed oppositely to the difference voltage and proportional to the sum of the voltage drops at the two resistors, every time the integration voltage exceeds an upper threshold value or drops below a lower threshold value in a compensation cycle, and determining the ratio of the number of the compensation cycles to the number of sampling cycles as a measure of the resistance ratio $\Delta R/R$.

2. Method according to claim 1 in which the compensation cycles are counted in a time window corresponding to a predetermined number of sampling cycles.

3. Arrangement for carrying out the method according to claim 1, comprising an integrating $S_C$ amplifier with an operational amplifier which has in the feedback circuit an integration capacitor, at least one input capacitor and cyclically controlled switches for alternately charging the or each input capacitor by one of the voltage drops in a clock time of each sampling cycle with charge transport to the integration capacitor and for discharging the or each input capacitor in a further clock time of each sampling cycle with the integration capacitor disconnected.

4. Arrangement according to claim 3 in which the or each input capacitor in the discharge clock time is applied to the offset voltage of the operational amplifier.

5. Arrangement according to claim 3 in which only one input capacitor is provided which in a clock time of each sampling cycle is charged by the voltage drop at one of the resistors and in a further clock time of the same sampling cycle is charged by the voltage drop at the other resistor with opposite sign.

6. Arrangement according to claim 5 in which to carry out a compensation cycle the input capacitor is charged twice in succession by the voltage drop at the same resistor.

7. Arrangement according to claim 3 in which two input capacitors are provided of which the one is charged in a clock time of each sampling cycle by the voltage drop at the one resistor and the other is charged in the same clock time by the voltage drop at the other resistor of opposite sign.

8. Arrangement according to claim 7 in which the voltage drops by which the two input capacitors are charged are interchanged from sampling cycle to sampling cycle.

9. Arrangement according to claim 7 comprising a further input capacitor which is charged in each compensation cycle to the sum of the voltage drops at the two resistors.

10. Arrangement according to claim 3 comprising an integrator which contains a second integration capacitor and after each sampling or compensation cycle is connected to the disconnected first integration capacitor of the $S_C$ amplifier in such a manner that the charge of the first integration capacitor is transferred to the second integration capacitor.

11. Arrangement according to claim 10 in which the integrator is formed by an operational amplifier in the feedback circuit of which the second integration capacitor lies and that the first integration capacitor for the charge transfer is connected to the two inputs of the operational amplifier.

12. Arrangement according to claim 10 comprising two threshold value comparators having inputs connected to the output of the integrator, the one threshold value comparator having an upper threshold and furnishing a signal indicating if its input voltage exceeds the upper threshold, and the second threshold value comparator having a lower threshold and furnishes a signal indicating if its input voltage drops below the lower threshold, a decoder logic connected to the outputs of the two threshold value comparators which decoder logic on reception of an output signal from one of the two threshold value comparators furnishes a compensation enable signal, a measuring cycle counter having a counting input to which the compensation enable signal is applied and a time window counter which receives at its counting input for each sampling cycle a counting clock pulse and when a predetermined count is reached supplies to the measuring cycle counter a signal which initiates the transfer of the count of the measuring cycle counter to a display device or evaluation device and the resetting of the measuring cycle counter.

13. Arrangement according to claim 12 in which the decoder logic furnishes a sign signal whose signal value is determined by which threshold value comparator last indicated the exceeding or dropping below of the associated threshold, and that the sign signal is supplied to the display or evaluation device.

14. Arrangement according to claim 13, comprising a control circuit controlling the cyclic actuation of the switches, which control circuit receives the compensation enable signal and the sign signal and on each reception of a compensation enable signal changes the cyclic actuation of the switches to execute a compensation cycle in dependence upon the sign signal.

15. Arrangement according to claim 3 in which to the output of the SC amplifier a sample and hold memory is connected which after each sampling cycle and after each compensation cycle is actuated for sampling and holding the output voltage of the SC amplifier.

16. Arrangement according to claim 15 comprising two threshold value comparators having inputs connected to the output of the sample and hold circuit, the one threshold value comparator having an upper threshold and furnishing a signal indicating if its input voltage exceeds the upper threshold, and the second threshold value comparator having a lower threshold and furnishes a signal indicating if its input voltage drops below the lower threshold, a decoder logic connected to the outputs of the two threshold value comparators which decoder logic on reception of an output signal from one of the two threshold value comparators furnishes a compensation enable signal, a measuring cycle counter having a counting input to which the compensation enable signal is applied and a time window counter which receives at its counting input for each sampling cycle a counting clock pulse and when a predetermined count is reached supplies to the measuring cycle counter a signal which initiates the transfer of the count of the measuring cycle counter to a display device or evaluation device and the resetting of the measuring cycle counter.

17. Arrangement according to claim 16 in which the decoder logic furnishes a sign signal whose signal value is determined by which threshold value comparator last indicated the exceeding or dropping below of the associated threshold, and that the sign signal is supplied to the display or evaluation device.

18. Arrangement according to claim 17 comprising a control circuit controlling the cyclic actuation of the switches, which control circuit receives the compensation enable signal and the sign signal and on each reception of a compensation enable signal changes the cyclic actuation of the switches to execute a compensation cycle in dependence upon the sign signal.

19. Arrangement according to claim 3 comprising two threshold value comparators having inputs connected to the output of the SC amplifier, the one threshold value comparator having an upper threshold and furnishing a signal indicating if its input voltage exceeds the upper threshold, and the second threshold value comparator having a lower threshold and furnishes a signal indicating if its input voltage drops below the lower threshold, a decoder logic connected to the outputs of the two threshold value comparators which decoder logic on reception of an output signal from one of the two threshold value comparators furnishes a compensation enable signal, a measuring cycle counter having a counting input to which the compensation enable signal is applied and a time window counter which receives at its counting input for each sampling cycle a counting clock pulse and when a predetermined count is reached supplies to the measuring cycle counter a signal which initiates the transfer of the count of the measuring cycle counter to a display device or evaluation device and the resetting of the measuring cycle counter.

20. Arrangement according to claim 19 in which the decoder logic furnishes a sign signal whose signal value is determined by which threshold value comparator last indicated the exceeding or dropping below of the associated threshold, and that the sign signal is supplied to the display or evaluation device.

21. Arrangement according to claim 20 comprising a control circuit controlling the cyclic actuation of the switches, which control circuit receives the compensation enable signal and the sign signal and on each reception of a compensation enable signal changes the cyclic actuation of the switches to executea compensation cycle in dependence upon the sign signal.

* * * * *

UNITED STATES PATENT AND TRADEMARK OFFICE
CERTIFICATE OF CORRECTION

PATENT NO. : 4,816,745

DATED : March 28, 1989

INVENTOR(S) : Georg Schneider

It is certified that error appears in the above-identified patent and that said Letters Patent is hereby corrected as shown below:

On the bibliography page under the heading "FOREIGN PATENT DOCUMENT", please insert the following:

--2312858    9/1974    Germany
      3118770    3/1982    Germany--;

At column 2, line 30, after "9", please insert --are--;

At column 4, line 23, please delete "Appliedto" and insert therefor --Applied to--;

At column 4, line 42, please delete "$U_H$drops" and insert therefor --$U_H$ drops--;

At column 4, line 56, please delete "o" and insert therefor --to--;

At column 5, line 28, please delete "oontrol" and insert therefor --control--;

At column 10, line 36, after "$S_A$", please insert --.-- (period);

At column 11, please delete equation (24), and insert therefor $$\Delta Q_1 = a \cdot C \cdot U_1 - b \cdot C \cdot U_2$$

UNITED STATES PATENT AND TRADEMARK OFFICE
CERTIFICATE OF CORRECTION

PATENT NO. : 4,816,745

DATED : March 28, 1989

INVENTOR(S) : Georg Schneider

It is certified that error appears in the above-identified patent and that said Letters Patent is hereby corrected as shown below:

At column 16, line 47, please delete "executea" and insert therefor --execute a--.

Signed and Sealed this

Twenty-eighth Day of November 1989

*Attest:*

JEFFREY M. SAMUELS

*Attesting Officer*   *Acting Commissioner of Patents and Trademarks*